United States Patent
Yuan et al.

(10) Patent No.: US 11,107,545 B2
(45) Date of Patent: Aug. 31, 2021

(54) SHIFT REGISTER, GATE DRIVE CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Can Yuan, Beijing (CN); Zhidong Yuan, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 52 days.

(21) Appl. No.: 16/495,206

(22) PCT Filed: Mar. 22, 2019

(86) PCT No.: PCT/CN2019/079327
§ 371 (c)(1),
(2) Date: Sep. 18, 2019

(87) PCT Pub. No.: WO2019/196631
PCT Pub. Date: Oct. 17, 2019

(65) Prior Publication Data
US 2020/0160928 A1    May 21, 2020

(51) Int. Cl.
*G11C 19/28* (2006.01)
*G09G 3/36* (2006.01)
(Continued)

(52) U.S. Cl.
CPC ......... *G11C 19/188* (2013.01); *G09G 3/3266* (2013.01); *G09G 3/3677* (2013.01);
(Continued)

(58) Field of Classification Search
CPC ............... G09G 3/3266; G09G 3/3677; G09G 2300/0408; G09G 2310/0267; G09G 2310/0286; G11C 19/188; G11C 19/28
See application file for complete search history.

(56) References Cited

U.S. PATENT DOCUMENTS 10,573,245 B2 * 2/2020 Li .................. G11C 19/184
2012/0182283 A1 7/2012 Park
(Continued)

FOREIGN PATENT DOCUMENTS

CN    104867438 A    8/2015
CN    106157912 A    11/2016
(Continued)

OTHER PUBLICATIONS

Notice of Preliminary Rejection, Korean Patent Application No. 10-2019-7031884, dated Oct. 29, 2020.

*Primary Examiner* — Patrick O Neill
(74) *Attorney, Agent, or Firm* — The Webb Law Firm

(57) ABSTRACT

This application discloses a shift register, a gate drive circuit and a display device. The signal of the input signal terminal is provided to the pull-up node by the input circuit under the control of the input signal terminal; and the signal of the second reference signal terminal is provided to the output signal terminal by the output circuit under the control of the clock signal terminal and the signal of the pull-up node. The signal of the first reference signal terminal is provided to the pull-up node by the reset circuit under the control of the input signal terminal and the clock signal terminal. The pull-down control circuit resets the output signal terminal according to the signal of the first reference signal terminal.

19 Claims, 11 Drawing Sheets

(51) Int. Cl.
    *G11C 19/18*         (2006.01)
    *G09G 3/3266*      (2016.01)

(52) U.S. Cl.
    CPC ..... *G11C 19/28* (2013.01); *G09G 2300/0842* (2013.01); *G09G 2310/0286* (2013.01)

(56) References Cited

U.S. PATENT DOCUMENTS

| | | |
|---|---|---|
| 2014/0093028 A1 | 4/2014 | Wu |
| 2017/0032750 A1 | 2/2017 | Shao et al. |
| 2017/0269769 A1 | 9/2017 | Hu |
| 2017/0309211 A1 | 10/2017 | Zhang |
| 2019/0027079 A1* | 1/2019 | Shang ................ G11C 19/287 |

FOREIGN PATENT DOCUMENTS

| | | |
|---|---|---|
| CN | 106531053 A | 3/2017 |
| CN | 108511025 A | 9/2018 |
| KR | 1020120082660 A | 7/2012 |
| KR | 1020130115908 A | 10/2013 |
| KR | 1020130139328 A | 12/2013 |
| KR | 1020170041685 A | 4/2017 |

\* cited by examiner

SHIFT REGISTER, GATE DRIVE CIRCUIT AND DISPLAY DEVICE

CROSS-REFERENCE TO RELATED APPLICATIONS

This application claims priority under 35 U.S.C. § 371 to International Patent Application No. PCT/CN2019/079327 filed on Mar. 22, 2019, which claims priority to Chinese Patent Application No. 201810326790.0 filed on Apr. 12, 2018, the contents of both of which are incorporated herein by reference in their entirety for all purposes.

TECHNICAL FIELD

The present invention relates to a shift register, a gate drive circuit and a display device.

BACKGROUND

With the rapid development of display technologies, display panels are increasingly developed towards high integration and low cost. In the GOA (Gate Driver on Array) technology, a TFT (Thin Film Transistor) gate drive circuit is integrated on an array substrate of the display panel to form a scan drive for the display panel, so as to omit a wiring space for a bonding area and a fan-out area of a gate integrated circuit (IC), which not only can reduce product cost in terms of material cost and manufacturing process, but also can design the display panel to have a beautiful appearance with symmetrical two sides and a narrow frame.

SUMMARY

An embodiment of this disclosure provides a shift register comprising: an input circuit, a reset circuit, a pull-down control circuit and an output circuit;
wherein the input circuit is configured to, under the control of an input signal terminal, provide a signal of the input signal terminal to a pull-up node;
the reset circuit is configured to, under the control of the input signal terminal and a clock signal terminal, provide a signal of a first reference signal terminal to the pull-up node;
the output circuit is configured to, under the control of the clock signal terminal and a signal of the pull-up node, provide a signal of a second reference signal terminal to an output signal terminal; and
the pull-down control circuit is configured to reset the output signal terminal according to the signal of the first reference signal terminal.

In an example, in the shift register provided in the embodiment of this disclosure, the reset circuit comprises a clock converting circuit and a switching transistor.

In an example, in the shift register provided in the embodiment of this disclosure, the clock converting circuit is a NOR gate and the switching transistor is a first switching transistor;
a first input terminal of the NOR gate is connected with the input signal terminal, a second input terminal of the NOR gate is connected with the clock signal terminal, and an output terminal of the NOR gate is connected with a gate electrode of the first switching transistor;
a first electrode of the first switching transistor is connected with the first reference signal terminal, and a second electrode of the first switching transistor is connected with the pull-up node.

In an example, in the shift register provided in the embodiment of this disclosure, the clock converting circuit is a NAND gate and the switching circuit is a second switching transistor;
a first input terminal of the NAND gate is connected with the input signal terminal, a second input terminal of the NAND gate is connected with the clock signal terminal, and an output terminal of the NAND gate is connected with a gate electrode of the second switching transistor;
a first electrode of the second switching transistor is connected with the first reference signal terminal, and a second electrode of the second switching transistor is connected with the pull-up node.

In an example, in the shift register provided in the embodiment of this disclosure, the output circuit comprises a third switching transistor, a fourth switching transistor, and a storage capacitor;
a gate electrode of the third switching transistor is connected with the pull-up node, a first electrode of the third switching transistor is connected with the clock signal terminal, and a second electrode of the third switching transistor is connected with a gate electrode of the fourth switching transistor;
a first electrode of the fourth switching transistor is connected with the second reference signal terminal, and a second electrode of the fourth switching transistor is connected with the output signal terminal; and
the storage capacitor is connected between the pull-up node and the output signal terminal.

In an example, in the shift register provided in the embodiment of this disclosure, the pull-down control circuit comprises a first pull-down control sub-circuit and/or a second pull-down control sub-circuit;
the first pull-down control sub-circuit is configured to provide the signal of the first reference signal terminal to the output signal terminal when a level of the signal of the pull-up node is opposite to a level of a valid pulse signal of the input signal terminal;
the second pull-down control sub-circuit is configured to provide the signal of the first reference signal terminal to the output signal terminal when a level of the clock signal terminal is opposite to the level of the valid pulse signal of the input signal terminal.

In an example, in the shift register provided in the embodiment of this disclosure, the first pull-down control sub-circuit comprises a fifth switching transistor, a sixth switching transistor, and a seventh switching transistor;
a gate electrode and a first electrode of the fifth switching transistor are both connected with the second reference signal terminal, and a second electrode of the fifth switching transistor is connected with the first pull-down node;
a gate electrode of the sixth switching transistor is connected with the pull-up node, a first electrode of the sixth switching transistor is connected with the first reference signal terminal, and a second electrode of the sixth switching transistor is connected with the first pull-down node;
a gate electrode of the seventh switching transistor is connected with the first pull-down node, a first electrode of the seventh switching transistor is connected with the first reference signal terminal, and a second electrode of the seventh switching transistor is connected with the output signal terminal.

In an example, in the shift register provided in the embodiment of this disclosure, the second pull-down control sub-circuit comprises an eighth switching transistor, a ninth switching transistor, and a tenth switching transistor;

a gate electrode and a first electrode of the eighth switching transistor are both connected with the second reference signal terminal, and a second electrode of the eighth switching transistor is connected with the second pull-down node;

a gate electrode of the ninth switching transistor is connected with the clock signal terminal, a first electrode of the ninth switching transistor is connected with the first reference signal terminal, and a second electrode of the ninth switching transistor is connected with the second pull-down node;

a gate electrode of the tenth switching transistor is connected with the second pull-down node, a first electrode of the tenth switching transistor is connected with the first reference signal terminal, and a second electrode of the tenth switching transistor is connected with the output signal terminal.

In an example, in the shift register provided in the embodiment of this disclosure, the input circuit includes an eleventh switching transistor; and a gate electrode and a first electrode of the eleventh switching transistor are both connected with the input signal terminal, and a second electrode of the eleventh switching transistor is connected with the pull-up node.

Accordingly, an embodiment of this disclosure further provides a gate drive circuit comprising: a plurality of cascaded shift registers provided in the embodiment of this disclosure;

wherein the input signal terminal of a first stage of the shift registers is connected with a frame trigger signal terminal; and except for the first stage of the shift registers, the input signal terminals of other stages of the shift registers are respectively connected with the output signal terminals of their adjacent previous stage of the shift registers.

Accordingly, an embodiment of this disclosure further provides a display device comprising the gate drive circuit provided in the embodiment of this disclosure.

DETAILED DESCRIPTION

In order to make the objects, technical solutions and advantages of this disclosure more apparent, specific embodiments of the shift register, the gate drive circuit and the display device provided in the embodiments of this disclosure are described in detail below with reference to the accompanying drawings. It should be understood that the preferred embodiments described below are for the purpose of illustrating and explaining this disclosure only and are not intended to limit this disclosure. And the embodiments and features of the embodiments in the present application may be combined with each other without conflicts.

A related GOA circuit is generally composed of a plurality of cascaded shift registers, each correspondingly connected with a gate line for outputting a drive signal to drive the connected gate line. At present, generally, each stage of the shift registers needs the use of a plurality of clock signals for shift output of the drive signals, so that a plurality of clock signal lines for transmitting the clock signals are needed, which increases wiring difficulty and enlarges the occupied space, and thus goes against narrow frame design of the display panel.

Embodiments of the invention provide a shift register, a gate drive circuit and a display device, for solving the problem that the use of more clock signal lines increases wiring difficulty and enlarges the occupied space, and thus goes against narrow frame design of the display panel.

Figure 1:
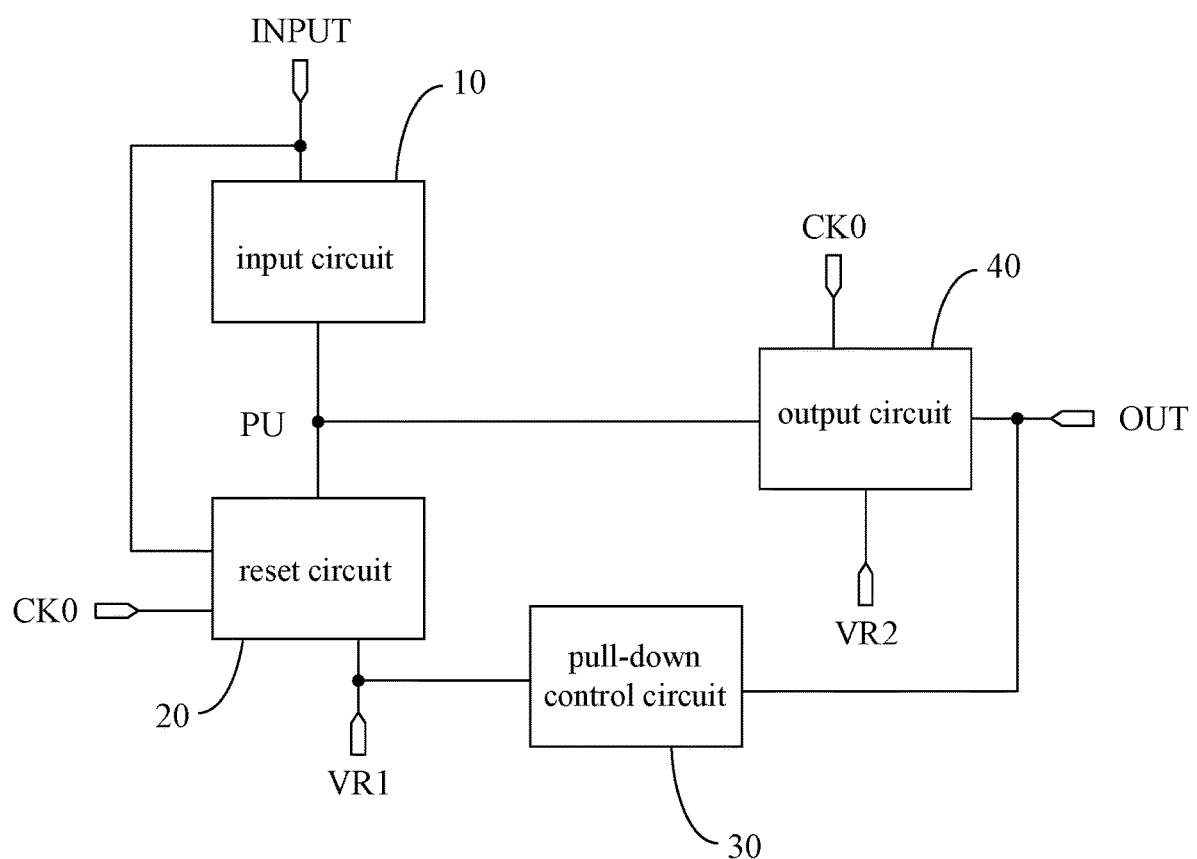
FIG. 1 is a first schematic diagram showing a structure of a shift register according to an embodiment of this disclosure.

According to an embodiment of this disclosure, a shift register is provided, as shown in FIG. 1, comprising: an input circuit 10, a reset circuit 20, a pull-down control circuit 30, and an output circuit 40.

The input circuit 10 is configured to, under the control of an input signal terminal INPUT, provide a signal of the input signal terminal INPUT to a pull-up node PU.

The reset circuit 20 is configured to, under the control of the input signal terminal INPUT and a clock signal terminal CK0, provide a signal of a first reference signal terminal VR1 to the pull-up node PU.

The output circuit 40 is configured to, under the control of the clock signal terminal CK0 and a signal of the pull-up node PU, provide a signal of a second reference signal terminal VR2 to an output signal terminal OUT.

The pull-down control circuit 30 is configured to reset the output signal terminal OUT according to the signal of the first reference signal terminal VR1.

According to the shift register provided in the embodiment of this disclosure, the signal of the input signal terminal is provided to the pull-up node by the input circuit under the control of the input signal terminal; and the signal of the second reference signal terminal is provided to the output signal terminal by the output circuit under the control of the clock signal terminal and the signal of the pull-up node, so that the output signal terminal outputs a valid pulse signal. The signal of the first reference signal terminal is provided to the pull-up node by the reset circuit under the control of the input signal terminal and the clock signal terminal so as to reset the pull-up node. The pull-down control circuit resets the output signal terminal according to the signal of the first reference signal terminal so as to enable the output signal terminal to output an invalid pulse signal. In this way, through the cooperation of the four circuits, the shift register can realize normal shift output only under the control of the signal of one clock signal terminal, so that the output signal terminal of the shift register outputs a scan signal required by a corresponding gate line, which can reduce the number of the set clock signal lines, further reduces wiring difficulty and the occupied space, and is good for narrow frame design of the display panel.

In a specific implementation, in an embodiment of this disclosure, the valid pulse signal of the input signal terminal is a high level signal, the signal of the first reference signal terminal is a low level signal, the signal of the second reference signal terminal is a high level signal, the valid pulse signal of the output signal terminal is a high level signal, and the invalid pulse signal of the output signal terminal is a low level signal.

Alternatively, the valid pulse signal of the input signal terminal is a low level signal, the signal of the first reference signal terminal is a high level signal, the signal of the second reference signal terminal is a low level signal, the valid pulse signal of the output signal terminal is a low level signal, and the invalid pulse signal of the output signal terminal is a high level signal. In practical applications, specific voltages of the signals shall be designed and determined according to practical application environments, and are not limited herein.

This disclosure is described in detail below with reference to specific embodiments. It should be noted that this embodiment is provided for better explanation of this disclosure, but not for limitation of this disclosure.

Figure 2:
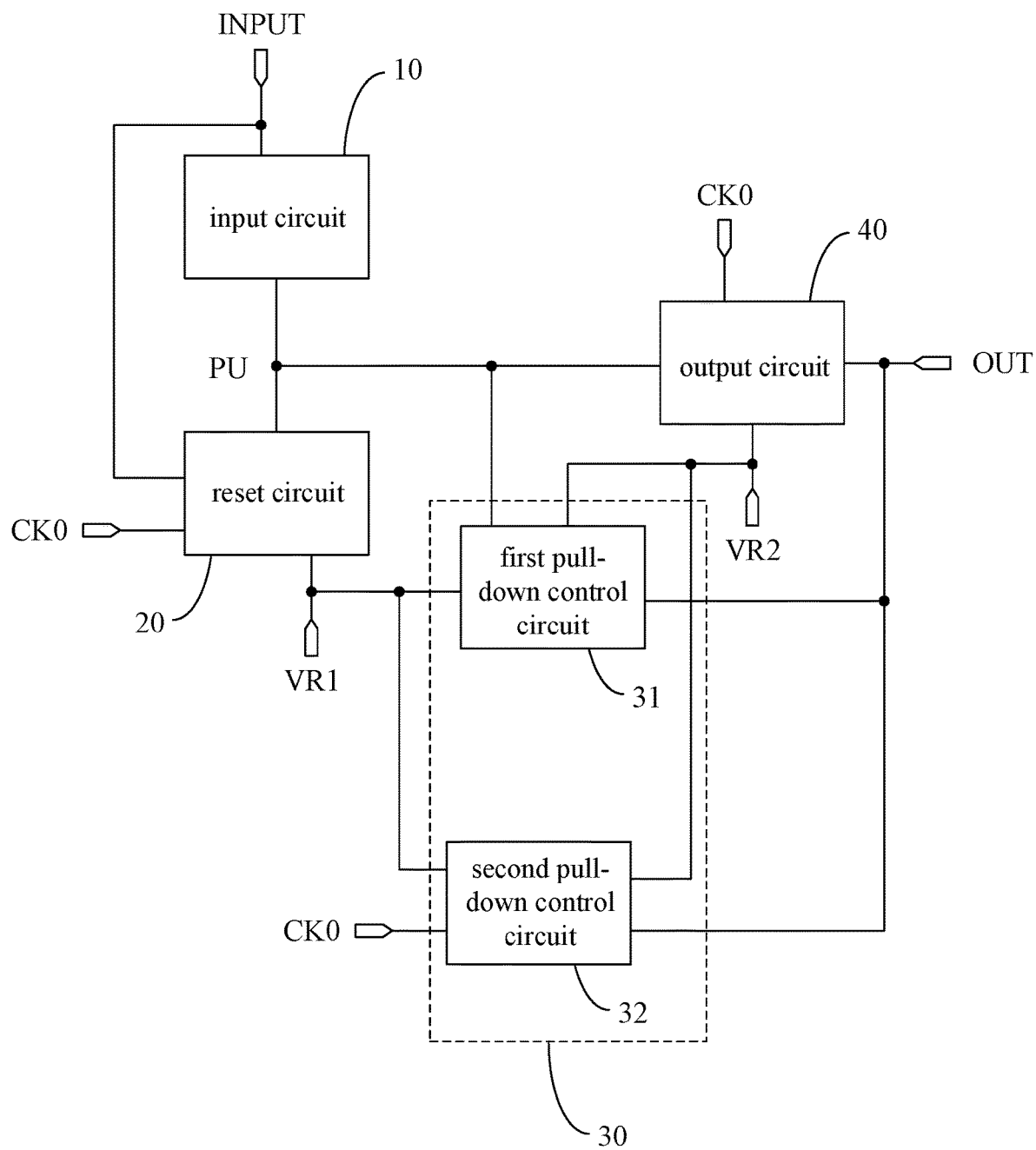
FIG. 2 is a second schematic diagram showing a structure of a shift register according to an embodiment of this disclosure.

In a specific implementation, in an embodiment of this disclosure, as shown in FIG. 2, the pull-down control circuit 30 may comprise: a first pull-down control sub-circuit 31; wherein the first pull-down control sub-circuit 31 may be configured to provide the signal of the first reference signal terminal VR1 to the output signal terminal OUT when a level of the signal of the pull-up node PU is opposite to a level of the valid pulse signal of the input signal terminal INPUT.

Alternatively, in a specific implementation, as shown in FIG. 2, the pull-down control circuit 30 may also comprise: a second pull-down control sub-circuit 32; wherein the second pull-down control sub-circuit 32 is configured to provide the signal of the first reference signal terminal VR1 to the output signal terminal OUT when a level of the clock signal terminal CK0 is opposite to the level of the valid pulse signal of the input signal terminal INPUT.

Further, in a specific implementation, in an embodiment of this disclosure, as shown in FIG. 2, the pull-down control circuit 30 may also comprise: a first pull-down control sub-circuit 31 and a second pull-down control sub-circuit 32; wherein the first pull-down control sub-circuit 31 may be configured to provide the signal of the first reference signal terminal VR1 to the output signal terminal OUT when a level of the signal of the pull-up node PU is opposite to a level of the valid pulse signal of the input signal terminal INPUT, and the second pull-down control sub-circuit 32 is configured to provide the signal of the first reference signal terminal VR1 to the output signal terminal OUT when a level of the clock signal terminal CK0 is opposite to the level of the valid pulse signal of the input signal terminal INPUT.

Figure 3:
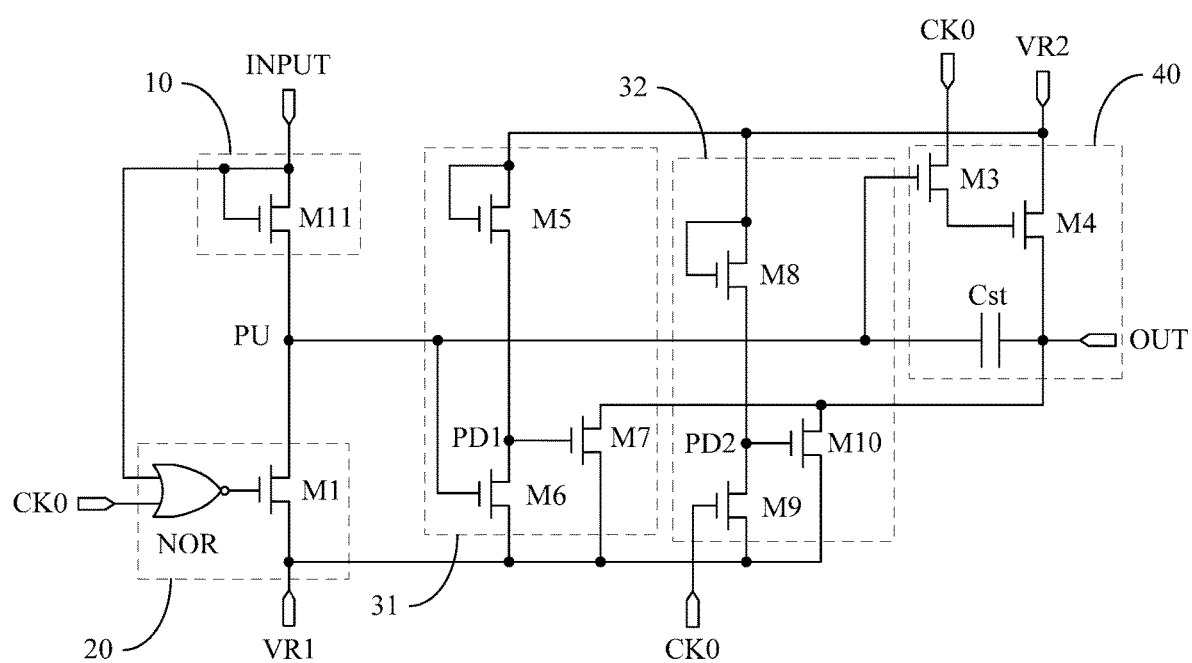
FIG. 3 is a first schematic diagram showing an exemplary specific structure of a shift register according to an embodiment of this disclosure.

In a specific implementation, in an embodiment of this disclosure, as shown in FIG. 3, the first pull-down control sub-circuit 31 may comprise: a fifth switching transistor M5, a sixth switching transistor M6, and a seventh switching transistor M7; wherein, a gate electrode and a first electrode of the fifth switching transistor M5 are both connected with the second reference signal terminal VR2, and a second electrode of the fifth switching transistor is connected with the first pull-down node PD1. A gate electrode of the sixth switching transistor M6 is connected with the pull-up node PU, a first electrode of the sixth switching transistor M6 is connected with the first reference signal terminal VR1, and a second electrode of the sixth switching transistor M6 is connected with the first pull-down node PD1. A gate electrode of the seventh switching transistor M7 is connected with the first pull-down node PD1, a first electrode of the seventh switching transistor M7 is connected with the first reference signal terminal VR1, and a second electrode of the seventh switching transistor M7 is connected with the output signal terminal OUT.

In a specific implementation, the fifth switching transistor forms a diode structure and is connected between the second reference signal terminal and the first pull-down node. When the sixth switching transistor is turned on under the control of the pull-up node, the second reference signal terminal and the first reference signal terminal are connected through the fifth switching transistor and the sixth switching transistor, which is equivalent to that the first reference signal terminal and the first pull-down node are connected, so that the seventh switching transistor is turned off under the control of the signal of the first pull-down node. When the sixth switching transistor is turned off under the control of the signal of the pull-up node, the second reference signal terminal and the first reference signal terminal are disconnected, which is equivalent to that the first pull-down node is directly connected with the second reference signal terminal, so that the seventh switching transistor is turned on under the control of the signal of the first pull-down node, thereby providing the signal of the first reference signal terminal to the output signal terminal to reset the output signal terminal.

In a specific implementation, in an embodiment of this disclosure, as shown in FIG. 3, the second pull-down control sub-circuit 32 may comprise: an eighth switching transistor M8, a ninth switching transistor M9, and a tenth switching transistor M10; wherein, a gate electrode and a first electrode of the eighth switching transistor M8 are both connected with the second reference signal terminal VR2, and a second electrode of the eighth switching transistor M8 is connected with the second pull-down node PD2.

A gate electrode of the ninth switching transistor M9 is connected with the clock signal terminal CK0, a first electrode of the ninth switching transistor M9 is connected with the first reference signal terminal VR1, and a second electrode of the ninth switching transistor M9 is connected with the second pull-down node PD2.

A gate electrode of the tenth switching transistor M10 is connected with the second pull-down node PD2, a first electrode of the tenth switching transistor M10 is connected with the first reference signal terminal VR1, and a second electrode of the tenth switching transistor M10 is connected with the output signal terminal OUT.

In a specific implementation, the eighth switching transistor forms a diode structure and is connected between the second reference signal terminal and the second pull-down node. When the ninth switching transistor is turned on under the control of the clock signal terminal, the second reference signal terminal and the first reference signal terminal may be connected through the eighth switching transistor and the ninth switching transistor, which is equivalent to that the first reference signal terminal and the second pull-down node are connected, so that the tenth switching transistor is turned off under the control of the signal of the second pull-down node. When the ninth switching transistor is turned off under the control of the clock signal terminal, the second reference signal terminal and the first reference signal terminal are disconnected, which is equivalent to that the second pull-down node is directly connected with the second reference signal terminal, so that the tenth switching transistor is turned on under the control of the signal of the second pull-down node, thereby providing the signal of the first reference signal terminal to the output signal terminal to reset the output signal terminal.

In a specific implementation, in an embodiment of this disclosure, as shown in FIG. 3, the input circuit 10 may comprise: an eleventh switching transistor M11; wherein a gate electrode and a first electrode of the eleventh switching transistor M11 are both connected with the input signal terminal INPUT, and a second electrode of the eleventh switching transistor M11 is connected with the pull-up node PU.

In a specific implementation, when the eleventh switching transistor is turned on under the control of the input signal terminal, the signal of the input signal terminal can be provided to the pull-up node.

In a specific implementation, the reset circuit 20 may comprise a clock converting circuit and a switching transistor.

In a specific implementation, in an embodiment of this disclosure, as shown in FIG. 3, the reset circuit 20 may comprise: a NOR gate NOR and a first switching transistor Ml; wherein a first input terminal of the NOR gate NOR is connected with the input signal terminal INPUT, a second input terminal of the NOR gate NOR is connected with the clock signal terminal CK0, and an output terminal of the NOR gate NOR is connected with a gate electrode of the first switching transistor M1.

A first electrode of the first switching transistor M1 is connected with the first reference signal terminal VR1, and a second electrode of the first switching transistor M1 is connected with the pull-up node PU.

In a specific implementation, the NOR gate may output a high level signal from its output terminal only when all its input terminals are low level signals, and output a low level signal from its output terminal in other cases. The first switching transistor may provide the signal of the first reference signal terminal to the pull-up node when it is turned on under the control of the signal of its gate electrode.

Figure 4:
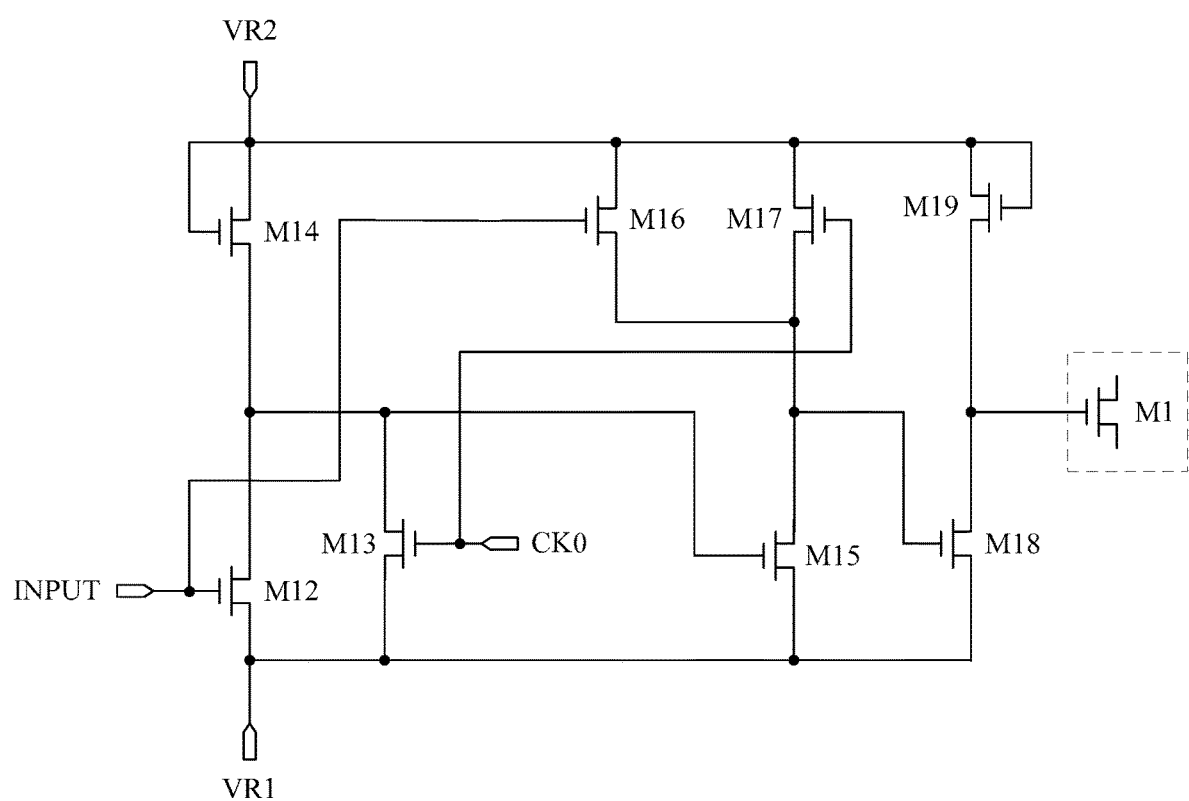
FIG. 4 is a schematic diagram showing an exemplary specific structure of a NOR gate according to an embodiment of this disclosure.

In a specific implementation, as shown in FIG. 4, the NOR gate may comprise: a twelfth switching transistor M12, a thirteenth switching transistor M13, a fourteenth switching transistor M14, a fifteenth switching transistor M15, a sixteenth switching transistor M16, a seventeenth switching transistor M17, an eighteenth switching transistor M18, and a nineteenth switching transistor M19.

A gate electrode of the twelfth switching transistor M12 is connected with the input signal terminal INPUT, a first electrode of the twelfth switching transistor M12 is connected with the first reference signal terminal VR1, and a second electrode of the twelfth switching transistor M12 is connected with a gate electrode of the fifteenth switching transistor M15.

A gate electrode of the thirteenth switching transistor M13 is connected with the clock signal terminal CK0, a first electrode of the thirteenth switching transistor M13 is connected with the first reference signal terminal VR1, and a second electrode of the thirteenth switching transistor M13 is connected with the gate electrode of the fifteenth switching transistor M15.

A gate electrode and a first electrode of the fourteenth switching transistor M14 are both connected with the second reference signal terminal VR2, and a second electrode of the fourteenth switching transistor M14 is connected with the gate electrode of the fifteenth switching transistor M15.

A first electrode of the fifteenth switching transistor M15 is connected with the first reference signal terminal VR1, and a second electrode of the fifteenth switching transistor M15 is connected with a gate electrode of the eighteenth switching transistor M18.

A gate electrode of the sixteenth switching transistor M16 is connected with the input signal terminal INPUT, a first electrode of the sixteenth switching transistor M16 is connected with the second reference signal terminal VR2, and a second electrode of the sixteenth switching transistor M16 is connected with the gate electrode of the eighteenth switching transistor M18.

A gate electrode of the seventeenth switching transistor M17 is connected with the clock signal terminal CK0, a first electrode of the seventeenth switching transistor M17 is connected with the second reference signal terminal VR2, and a second electrode of the seventeenth switching transistor M17 is connected with the gate electrode of the eighteenth switching transistor M18.

A first electrode of the eighteenth switching transistor M18 is connected with the first reference signal terminal VR1, and a second electrode of the eighteenth switching transistor M18 is connected with the gate electrode of the first switching transistor Ml.

A gate electrode and a first electrode of the nineteenth switching transistor M19 are both connected with the second reference signal terminal VR2, and a second electrode of the nineteenth switching transistor M19 is connected with the gate electrode of the first switching transistor M1. Of course, the above is merely an example of a specific structure of the NOR gate. The NOR gate in the embodiments of this disclosure may also be the same as the structure in the related arts, and is not limited herein.

In a specific implementation, in an embodiment of this disclosure, as shown in FIG. 3, the output circuit 40 may comprise: a third switching transistor M3, a fourth switching transistor M4, and a storage capacitor Cst; wherein, the gate electrode of the third switching transistor M3 is connected with the pull-up node PU, the first electrode of the third switching transistor M3 is connected with the clock signal terminal CK0, and the second electrode of the third switching transistor M3 is connected with the gate electrode of the fourth switching transistor M4.

The first electrode of the fourth switching transistor M4 is connected with the second reference signal terminal VR2, and the second electrode of the fourth switching transistor M4 is connected with the output signal terminal OUT.

The storage capacitor Cst is connected between the pull-up node PU and the output signal terminal OUT.

In a specific implementation, when the third switching transistor is turned on under the control of the signal of the pull-up node, the signal of the clock signal terminal may be provided to the gate electrode of the fourth switching transistor. When the fourth switching transistor is turned on under the control of the signal of its gate electrode, the signal of the second reference signal terminal may be provided to the output signal terminal. The storage capacitor can store a voltage across both ends thereof, and when the pull-up node is in floating connection, a voltage difference across the both ends can be kept stable.

The above is merely an example of the specific structures of the circuits in the shift register provided in the embodiment of this disclosure, and in specific implementations, the specific structures of the circuits are not limited to the structures provided in the embodiment of this disclosure, and may be other structures known to those skilled in the art, and are not limited herein.

Further, in order to simplify the manufacturing process, in specific implementations, in the embodiment of this disclosure, as shown in FIG. 3, all the switching transistors may be N-type transistors.

It should be noted that the switching transistor mentioned in the above embodiments of this disclosure may be a Thin Film Transistor (TFT), and may also be a Metal Oxide Semiconductor (MOS), which is not limited herein. In a specific implementation, according to the type of the switching transistor and the signal of the signal terminal, the first electrode of the switching transistor may be a source electrode, and the second electrode of the switching transistor may be a drain electrode; alternatively, the first electrode may be a drain electrode, and the second electrode may be a source electrode, which is not limited herein.

The operation of the shift register shown in FIG. 3 will be described with reference to the circuit timing diagram shown in FIG. 5a. In the following description, 1 represents a high-level signal, 0 represents a low-level signal, and 1 and 0 represent logic levels thereof, which are provided only for better explaining the operation of the shift register provided in the embodiments of this disclosure, rather than the levels applied to the gate electrode of the switching transistors in the specific implementations.

Figure 5A:
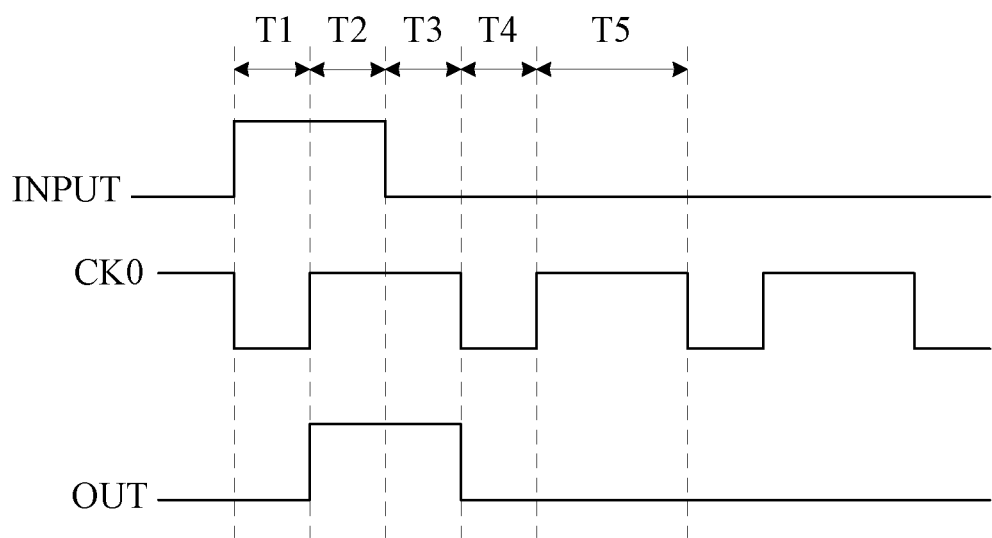
FIG. 5a is a first circuit timing diagram according to an embodiment of this disclosure.

Specifically, four stages T1, T2, T3, and T4 in FIG. 5a are selected. In addition, the valid pulse signal of the input signal terminal INPUT is a high level signal, the signal of the first reference signal terminal VR1 is a low level signal, and the signal of the second reference signal terminal VR2 is a high level signal.

In the T1 stage, INPUT=1, CK0=0.

Because of INPUT=1 and CK0=0, the NOR gate outputs a low level signal to control the first switching transistor M1 to be turned off. Because of INPUT=1, the eleventh switching transistor M11 is turned on to provide the high level signal of the input signal terminal INPUT to the pull-up node PU, so that the signal of the pull-up node PU is a high level signal, thereby controlling the third switching transistor M3 and the sixth switching transistor M6 to be turned on. The turned-on third switching transistor M3 provides the low-level signal of the clock signal terminal CK0 to the gate electrode of the fourth switching transistor M4 to control the fourth switching transistor M4 to be turned off. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the low level signal of the first reference signal terminal VR1, thereby controlling the seventh switching transistor M7 to be turned off. Since CK0=0, the ninth switching transistor M9 is turned off, which causes the second reference signal terminal VR2 and the first reference signal terminal VR1 to be turned off, so that the signal of the second pull-down node PD2 is equivalent to the high level signal of the second reference signal terminal VR2, thereby controlling the tenth switching transistor M10 to be turned on, to provide the low level signal of the first reference signal terminal to the output signal terminal OUT, so that the output signal terminal OUT outputs the low level signal.

In the T2 stage, INPUT=1, CK0=1.

Because of INPUT=1 and CK0=1, the NOR gate outputs a low level signal to control the first switching transistor M1 to be turned off. Because of INPUT=1, the eleventh switching transistor M11 is turned on to provide the high level signal of the input signal terminal INPUT to the pull-up node PU, so that the signal of the pull-up node PU is a high level signal, thereby controlling the third switching transistor M3 to be turned on to provide the high level signal of the clock signal terminal CK0 to the gate electrode of the fourth switching transistor M4, to control the fourth switching transistor M4 to be turned on, to provide the high level signal of the second reference signal terminal VR2 to the output signal terminal OUT. Due to the function of the storage capacitor Cst, the pull-up node PU can be further pulled high, so that the third switching transistor M3 and the sixth switching transistor M6 are completely turned on. The turned-on third switching transistor M3 may provide the high level signal of the clock signal terminal CK0 to the gate electrode of the fourth switching transistor M4, to control the fourth switching transistor M4 to be turned on to provide the high level signal of the second reference signal terminal VR 2 to the output signal terminal OUT, so that the output signal terminal OUT outputs a high level signal. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the low level signal of the first reference signal terminal VR1, thereby controlling the seventh switching transistor M7 to be turned off. Since CK0=1, the ninth switching transistor M9 is turned on, and thus the second reference signal terminal VR2 and the first reference signal terminal VR1 are connected through the eighth switching transistor M8 and the ninth switching transistor M9, so that the signal of the second pull-down node PD2 is equivalent to the low level signal of the first reference signal terminal VR1, thereby controlling the tenth switching transistor M10 to be turned off.

In the T3 stage, INPUT=0; CK0=1.

Because of INPUT=0 and CK0=1, the NOR gate outputs a low level signal to control the first switching transistor M1 to be turned off. Because of INPUT=0, the eleventh switching transistor M11 is turned off. Because of CK0=1, the ninth switching transistor M9 is turned on, and thus the second reference signal terminal VR2 and the first reference signal terminal VR1 are connected through the eighth switching transistor M8 and the ninth switching transistor M9, so that the signal of the second pull-down node PD2 is equivalent to the low level signal of the first reference signal terminal VR1, thereby controlling the tenth switching transistor M10 to be turned off. Therefore, the pull-up node PU is in floating connection, and the signal of the pull-up node PU still maintains a high level signal due to the function of the storage capacitor Cst, to control the third switching transistor M3 to be turned on to provide the high level signal of the clock signal terminal CK0 to the gate electrode of the fourth switching transistor M4, and to control the fourth switching transistor M4 to be turned on to provide the high level signal of the second reference signal terminal VR2 to the output signal terminal OUT. Due to the function of the storage capacitor Cst, the pull-up node PU can be further pulled high, so that the third switching transistor M3 and the sixth switching transistor M6 are completely turned on. The turned-on third switching transistor M3 may provide a high level signal of the clock signal terminal CK0 to the gate electrode of the fourth switching transistor M4, to control the fourth switching transistor M4 to be turned on to provide the high level signal of the second reference signal terminal VR2 to the output signal terminal OUT, so that the output signal terminal OUT outputs a high level signal. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the low level signal of the first reference signal terminal VR1, thereby controlling the seventh switching transistor M7 to be turned off.

In the T4 stage, INPUT=0, CK0=0.

Because of INPUT=0, the eleventh switching transistor M11 is turned off. Since INPUT=0 and CK0=0, the NOR gate outputs a high level signal to control the first switching transistor M1 to be turned on. The turned-on first switching transistor M1 provides the low level signal of the first reference signal terminal VR1 to the pull-up node PU to control the third switching transistor M3 and the sixth switching transistor M6 to be turned off. Since the sixth switching transistor M6 is turned off, the second reference signal terminal VR2 is disconnected from the first reference signal terminal VR1, so that the signal of the first pull-down node PD1 is equivalent to the high level signal of the second reference signal terminal VR2, thereby controlling the seventh switching transistor M7 to be turned on. The turned-on seventh switching transistor M7 provides the low level signal of the first reference signal terminal VR1 to the output signal terminal OUT, so that the output signal terminal OUT outputs the low level signal to reset the output signal terminal OUT. The ninth switching transistor M9 is turned off due to CK=0. Therefore, the second reference signal terminal VR2 is disconnected from the first reference signal terminal VR1, so that the signal of the second pull-down node PD2 is equivalent to the high level signal of the second reference signal terminal VR2, thereby controlling the tenth switching transistor M10 to be turned on. The turned-on tenth switching transistor M10 provides the low level signal of the first reference signal terminal VR1 to the output signal terminal OUT, so that the output signal terminal OUT outputs a low level signal to reset the output signal terminal OUT.

After the stage T4, a stage T5 may also be included, i.e., INPUT=0, CK0=1. The eleventh switching transistor M11 is turned off due to INPUT=0. Because of INPUT=0 and CK0=1, the NOR gate outputs a low level signal to control the first switching transistor M1 to be turned off. Therefore, the pull-up node PU is in floating connection, and the signal of the pull-up node PU maintains a low level signal due to the function of the storage capacitor Cst, so as to control the third switching transistor M3 and the sixth switching transistor M6 to be turned off. Since the sixth switching transistor M6 is turned off, the second reference signal terminal VR2 is disconnected from the first reference signal terminal VR1, so that the signal of the first pull-down node PD1 is equivalent to the high level signal of the second reference signal terminal VR2, thereby controlling the seventh switching transistor M7 to be turned on. The turned-on seventh switching transistor M7 provides the low level signal of the first reference signal terminal VR1 to the output signal terminal OUT, so that the output signal terminal OUT outputs the low level signal. The ninth switching transistor M9 is turned on due to CK0=1. Therefore, the second reference signal terminal VR2 and the first reference signal terminal VR1 are connected through the eighth switching transistor M8 and the ninth switching transistor M9, so that the signal of the second pull-down node PD2 is equivalent to the low level signal of the first reference signal terminal VR1, thereby controlling the tenth switching transistor M10 to be turned off.

According to the shift register provided in the embodiments of this disclosure, after the T5 stage, the operations in the T4 stage and the T5 stage may be repeatedly performed until the signal of the input signal terminal INPUT becomes a high level signal again.

As can be seen, the shift register provided in the embodiments of this disclosure only needs to input one clock signal to make the output signal terminal output the shifted signal, which can reduce the number of the set clock signal lines, thereby reduce the wiring difficulty and the occupied space, and is good for the narrow frame design of the display panel.

The shift register provided in the embodiments of this disclosure may control a duration of the valid pulse signal output by the output signal terminal only by changing a duration of the valid pulse signal of the clock signal terminal (i.e., a signal in the clock signal terminal having the same level as the valid pulse signal of the input signal terminal), without changing the circuit and the process, which can reduce the difficulty of the shift register, reduce processing complexity, and reduce the cost.

Figure 5B:
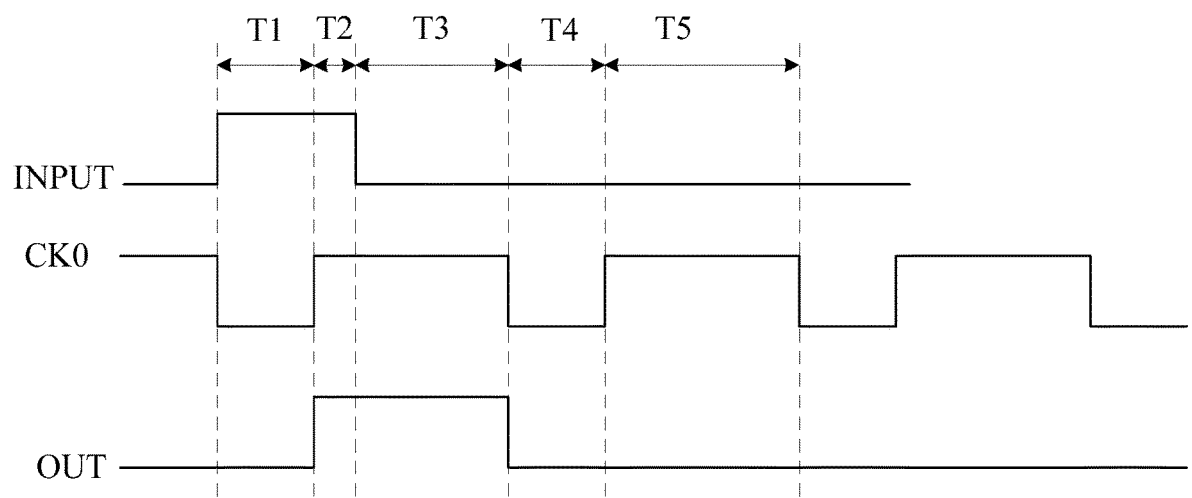
FIG. 5b is a second circuit timing diagram according to an embodiment of this disclosure.

The operation of the shift register provided in the embodiment of this disclosure will be described below in conjunction with the circuit timing diagram shown in FIG. 5b, by taking the structure of the shift register shown in FIG. 3 as an example. A duration of the high level signal of the clock signal terminal CK0 in one period in FIG. 5b is longer than a duration of the high level signal of the clock signal terminal CK0 in one period in FIG. 5a. A duration of the valid pulse signal of the input signal terminal INPUT in FIG. 5b is the same as the duration of the valid pulse signal of the input signal terminal INPUT in FIG. 5a. Moreover, in a display frame, only one rising edge of the clock signal terminal CK0 is located between the rising edge and the falling edge of the input signal terminal INPUT. Specifically, four stages T1, T2, T3 and T4 in FIG. 5b are selected. The signal of the first reference signal terminal VR1 is a low level signal, and the signal of the second reference signal terminal VR2 is a high level signal.

In the T1 stage, INPUT=1, CK0=0. A specific operation thereof is the same as the operation of the T1 stage described above, and is not described in detail herein.

In the T2 stage, INPUT=1, CK0=1.

Because of INPUT=1 and CK0=1, the NOR gate outputs a low level signal to control the first switching transistor M1 to be turned off. Due to INPUT=1, the eleventh switching transistor M11 is turned on to provide the high level signal of the input signal terminal INPUT to the pull-up node PU, so that the signal of the pull-up node PU is a high level signal, thereby controlling the third switching transistor M3 to be turned on to provide the high level signal of the clock signal terminal CK0 to the gate electrode of the fourth switching transistor M4, to control the fourth switching transistor M4 to be turned on to provide the high level signal of the second reference signal terminal VR2 to the output signal terminal OUT. Due to the function of the storage capacitor Cst, the pull-up node PU can be further pulled high, so that the third switching transistor M3 and the sixth switching transistor M6 are completely turned on. The turned-on third switching transistor M3 may provide the high level signal of the clock signal terminal CK0 to the gate electrode of the fourth switching transistor M4, to control the fourth switching transistor M4 to be turned on to provide the high level signal of the second reference signal terminal VR2 to the output signal terminal OUT, so that the output signal terminal OUT outputs a high level signal. Since the fifth switching transistor M5 forms a diode connection structure, the second reference signal terminal VR2 and the first reference signal terminal VRI are connected through the fifth switching transistor M5 and the sixth switching transistor M6, so that the signal of the first pull-down node PD1 is equivalent to the low level signal of the first reference signal terminal VR1, thereby controlling the seventh switching transistor M7 to be turned off. Since CK0=1, the ninth switching transistor M9 is turned on, and thus the second reference signal terminal VR2 and the first reference signal terminal VRI are connected through the eighth switching transistor M8 and the ninth switching transistor M9, so that the signal of the second pull-down node PD2 is equivalent to the low level signal of the first reference signal terminal VR1, thereby controlling the tenth switching transistor M10 to be turned off. It can be seen that the T2 stage in this embodiment is the same as the operation of the T2 stage described above.

In the T3 stage, INPUT=0, CK0=1.

Because of INPUT=0 and CK0=1, the NOR gate outputs a low level signal to control the first switching transistor M1 to be turned off. The eleventh switching transistor M11 is turned off due to INPUT=0. Since CK0=1, the ninth switching transistor M9 is turned on, and thus the second reference signal terminal VR2 and the first reference signal terminal VR1 are connected through the eighth switching transistor M8 and the ninth switching transistor M9, so that the signal of the second pull-down node PD2 is equivalent to the low level signal of the first reference signal terminal VR1, thereby controlling the tenth switching transistor M10 to be turned off. Therefore, the pull-up node PU is in floating connection, and the signal of the pull-up node PU maintains a high level signal due to the function of the storage capacitor Cst, to control the third switching transistor M3 to be turned on to provide the high level signal of the clock signal terminal CK0 to the gate electrode of the fourth switching transistor M4, and to control the fourth switching transistor M4 to be turned on to provide the high level signal of the second reference signal terminal VR2 to the output signal terminal OUT. Due to the function of the storage capacitor Cst, the pull-up node PU can be further pulled high, so that the third switching transistor M3 and the sixth switching transistor M6 are completely turned on. The turned-on third switching transistor M3 may provide a high level signal of the clock signal terminal CK0 to the gate electrode of the fourth switching transistor M4, to control the fourth switching transistor M4 to be turned on to provide the high level signal of the second reference signal terminal VR2 to the output signal terminal OUT, so that the output signal terminal OUT outputs a high level signal. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the low level signal of the first reference signal terminal VR1, thereby controlling the seventh switching transistor M7 to be turned off. It can be seen that the T3 stage in this embodiment is the same as the operation of the T3 stage described above.

In the T4 stage, INPUT=0, CK0=0. A specific operation thereof is the same as the operation in the T4 stage described above, and is not described in detail herein.

Of course, a T5 stage may be also included after the T4 stage, where INPUT=0, CK0=1. A specific operation thereof is the same as the operation in the T5 stage described above, and is not described in detail here.

According to the shift register provided in the embodiment of this disclosure, after the T5 stage, the operations of the T4 stage and the T5 stage may be repeatedly performed until the signal of the input signal terminal INPUT becomes a high level signal again.

Figure 6A:
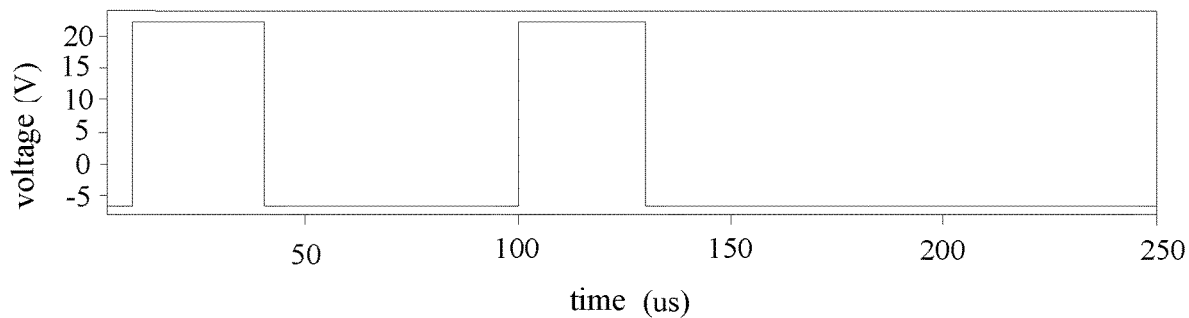
FIG. 6a is a simulated diagram showing the signal at the input signal terminal.
Figure 6B:
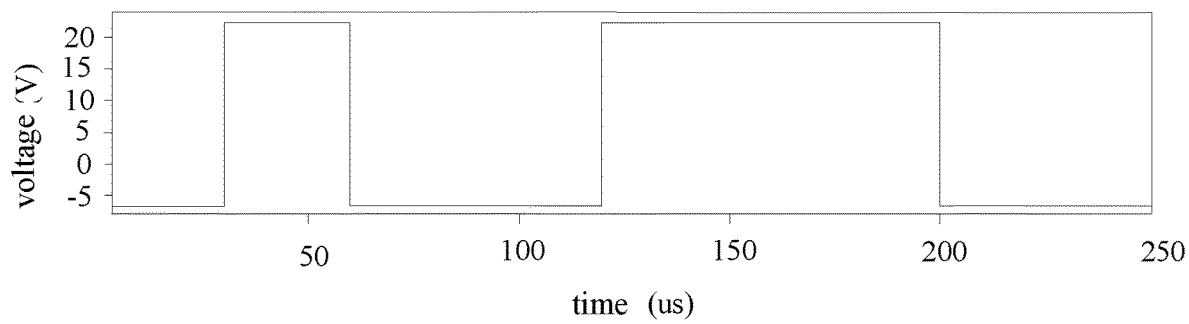
FIG. 6b is a simulated diagram showing the signal at the clock signal terminal.
Figure 6C:
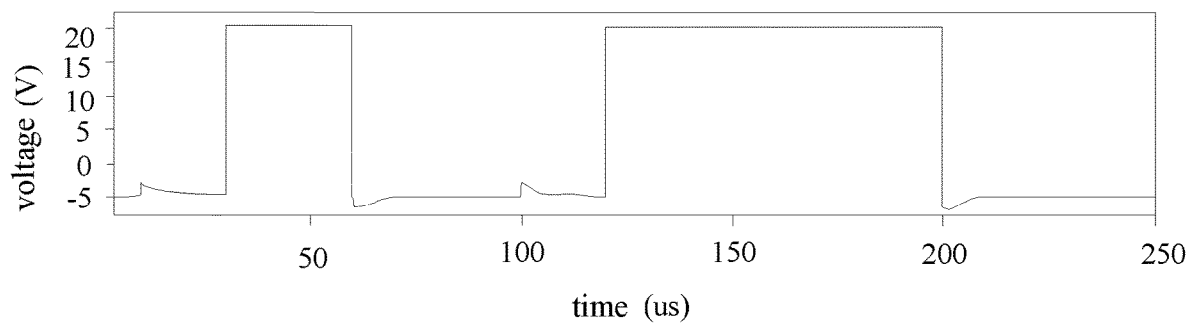
FIG. 6c is a simulated diagram showing the signal at the output signal terminal.

By taking the structure shown in FIG. 3 as an example, the simulation timing diagrams of the signals shown in FIGS. 6a to 6c are used to simulate the operation of the shift register. In FIGS. 6a to 6c, the ordinate represents a voltage, and the abscissa represents a time, where FIG. 6a represents the signal of the input signal terminal INPUT, FIG. 6b represents the signal of the clock signal terminal CK0, and FIG. 6c represents the signal of the output signal terminal OUT. As can be seen from FIGS. 6a to 6c, in the shift register provided in the embodiment of this disclosure, when the duration of the high-level signal of the clock signal terminal CK0 is extended, the high-level signal output by the output signal terminal OUT is also extended by a corresponding time.

The following describes the structure and operation of the shift register provided in the embodiment of this disclosure when the valid pulse signal of the input signal terminal is a low level signal.

The valid pulse signal of the input signal terminal is a low level signal, and the third to eleventh switching transistors M3 to M11 described above (for example, refer to FIG. 3) may be directly replaced with P-type transistors from N-type transistors, and their connection modes do not change, so as to serve as the structure of the shift register in the present embodiment. In addition, the same connection modes between the shift register provided in this embodiment and the shift register provided in the previous embodiment are omitted, and only different portions therebetween are described in the following.

Figure 7:
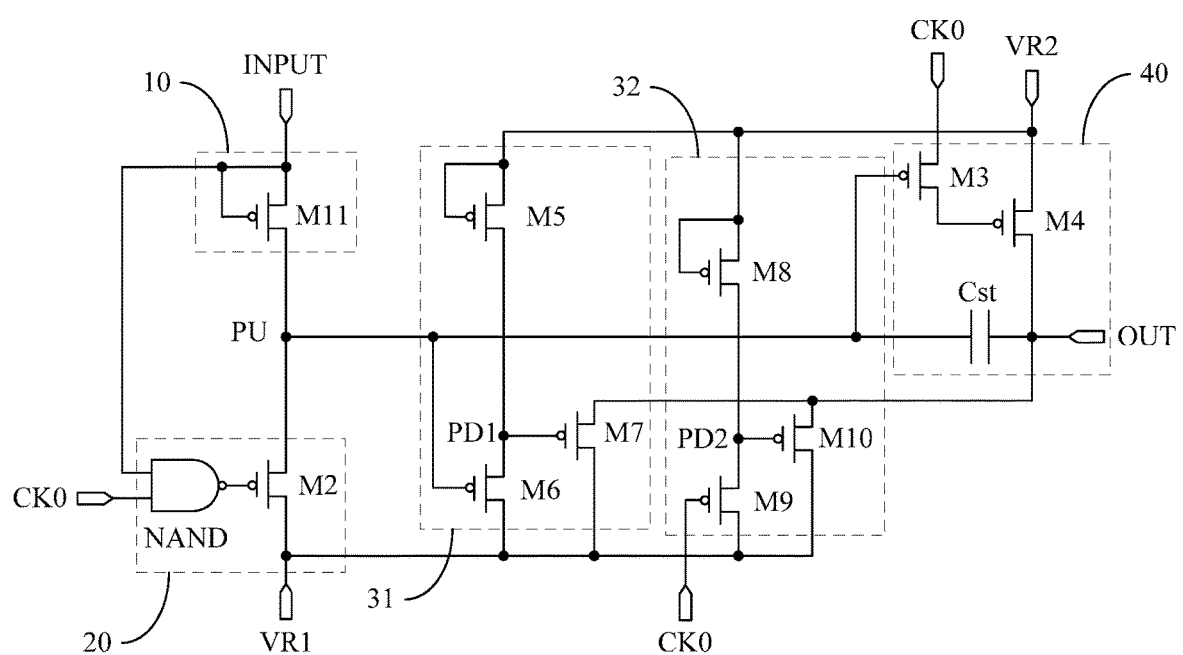
FIG. 7 is a second schematic diagram showing an exemplary specific stricture of a shift register according to this disclosure.

In a specific implementation, other embodiments can be also adopted for the specific structure of the reset circuit. In an embodiment of this disclosure, as shown in FIG. 7, the reset circuit may include: a NAND gate and a second switching transistor M2; wherein the first input terminal of the NAND gate is connected with the input signal terminal INPUT, the second input terminal of the NAND gate is connected with the clock signal terminal CK0, and the output terminal of the NAND gate is connected with the gate electrode of the second switching transistor M2. A first electrode of the second switching transistor M2 is connected with the first reference signal terminal VR1, and a second electrode of the second switching transistor M2 is connected with the pull-up node PU.

In a specific implementation, the output terminal of the NAND gate can output a low level signal only when all its input terminals are high level signals, and the output terminal of the NAND gate can output a high level signal in other cases. The second switching transistor may provide the signal of the first reference signal terminal to the pull-up node when it is turned on under the control of the signal of its gate electrode.

In a specific implementation, in the embodiment of this disclosure, as shown in FIG. 7, the second switching transistor M2 may be a P-type transistor.

In a specific implementation, in the embodiment of this disclosure, the structure of the NAND gate may be the same as that in the related art, and is not limited herein.

The operation of the shift register shown in FIG. 7 will be described below with reference to the circuit timing diagram shown in FIG. 8a. In the following description, 1 represents a high-level signal, 0 represents a low-level signal, and 1 and 0 represent logic levels thereof, which are provided only for better explaining the operation of the shift register provided in the embodiment of this disclosure, rather than the levels applied to the gate electrodes of the switching transistors in the specific implementation.

Figure 8A:
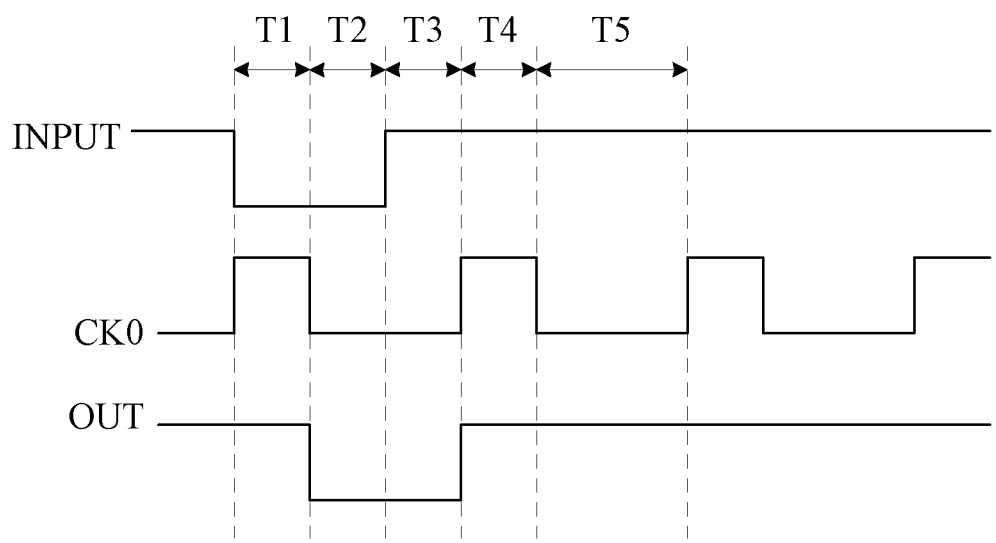
FIG. 8a is a third circuit timing diagram according to an embodiment of this disclosure.

Specifically, the four stages T1, T2, T3, and T4 in FIG. 8a are mainly selected.

In the T1 stage, INPUT=0, CK0=1.

Since INPUT=0 and CK0=1, the NAND gate outputs a high level signal to control the second switching transistor M2 to be turned off. Since the INPUT=0, the eleventh switching transistor M11 is turned on to provide the low level signal of the input signal terminal INPUT to the pull-up node PU, so that the signal of the pull-up node PU is a low level signal, thereby controlling the third switching transistor M3 and the sixth switching transistor M6 to be turned on. The turned-on third switching transistor M3 supplies the high-level signal of the clock signal terminal CK0 to the gate electrode of the fourth switching transistor M4, to control the fourth switching transistor M4 to be turned off. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the high level signal of the first reference signal terminal VR1, thereby controlling the seventh switching transistor M7 to be turned off. Since CK0=1, the ninth switching transistor M9 is turned off, which causes the second reference signal terminal VR2 and the first reference signal terminal VR1 to be turned off, so that the signal of the second pull-down node PD 2 is equivalent to the low level signal of the second reference signal terminal VR2, thereby controlling the tenth switching transistor M10 to be turned on to provide the high level signal of the first reference signal terminal to the output signal terminal OUT, so that the output signal terminal OUT outputs the high level signal.

In the T2 stage, INPUT=0, CK0=0.

Because of INPUT=0 and CK0=0, the NAND gate outputs a high level signal to control the second switching transistor M2 to be turned off. Because of INPUT=0, the eleventh switching transistor M11 is turned on to provide the low level signal of the input signal terminal INPUT to the pull-up node PU, so that the signal of the pull-up node PU is a low level signal, thereby controlling the third switching transistor M3 to be turned on to provide the low level signal of the clock signal terminal CK0 to the gate electrode of the fourth switching transistor M4, to control the fourth switching transistor M4 to be turned on to provide the low level signal of the second reference signal terminal VR2 to the output signal terminal OUT. Due to the function of the storage capacitor Cst, the pull-up node PU can be further pulled down, so that the third switching transistor M3 and the sixth switching transistor M6 are completely turned on. The turned-on third switching transistor M3 may provide the low level signal of the clock signal terminal CK0 to the gate electrode of the fourth switching transistor M4, to control the fourth switching transistor M4 to be turned on to provide the low level signal of the second reference signal terminal VR2 to the output signal terminal OUT, so that the output signal terminal OUT outputs a low level signal. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the high level signal of the first reference signal terminal VR1, thereby controlling the seventh switching transistor M7 to be turned off. Since CK0=0, the ninth switching transistor M9 is turned on, and thus the second reference signal terminal VR2 and the first reference signal terminal VR1 are connected through the eighth switching transistor M8 and the ninth switching transistor M9, so that the signal of the second pull-down node PD2 is equivalent to the high level signal of the first reference signal terminal VR1, thereby controlling the tenth switching transistor M10 to be turned off.

In the T3 stage, INPUT=1, CK0=0.

Because of INPUT=1 and CK0=0, the NAND gate outputs a high level signal to control the second switching transistor M2 to be turned off. The eleventh switching transistor M11 is turned off due to INPUT=1. Since CK0=0, the ninth switching transistor M9 is turned on, and thus the second reference signal terminal VR2 and the first reference signal terminal VR1 are connected through the eighth switching transistor M8 and the ninth switching transistor M9, so that the signal of the second pull-down node PD2 is equivalent to the high level signal of the first reference signal terminal VR1, thereby controlling the tenth switching transistor M10 to be turned off. Therefore, the pull-up node PU is in floating connection, and the signal of the pull-up node PU still maintains a low level signal due to the function of the storage capacitor Cst, to control the third switching transistor M3 to be turned on to provide the low level signal of the clock signal terminal CK0 to the gate electrode of the fourth switching transistor M4, and to control the fourth switching transistor M4 to be turned on to provide the low level signal of the second reference signal terminal VR2 to the output signal terminal OUT. Due to the function of the storage capacitor Cst, the pull-up node PU can be further pulled down, so that the third switching transistor M3 and the sixth switching transistor M6 are completely turned on. The turned-on third switching transistor M3 may provide the low level signal of the clock signal terminal CK0 to the gate electrode of the fourth switching transistor M4, to control the fourth switching transistor M4 to be turned on to provide the low level signal of the second reference signal terminal VR2 to the output signal terminal OUT, so that the output signal terminal OUT outputs a low level signal. Since the fifth switching transistor M5 forms a diode connection structure, the second reference signal terminal VR2 and the first reference signal terminal VR1 are connected through the fifth switching transistor M5 and the sixth switching transistor M6, so that the signal of the first pull-down node PD1 is equivalent to the high level signal of the first reference signal terminal VR1, thereby controlling the seventh switching transistor M7 to be turned off.

In the T4 stage, INPUT=1, CK0=1.

The eleventh switching transistor M11 is turned off due to INPUT=1. Because of INPUT=1 and CK0=1, the NAND gate outputs a low level signal to control the second switching transistor M2 to be turned on. The turned-on second switching transistor M2 provides the high level signal of the first reference signal terminal VR1 to the pull-up node PU to control the third switching transistor M3 and the sixth switching transistor M6 to be turned off. Since the sixth switching transistor M6 is turned off, the second reference signal terminal VR2 is disconnected from the first reference signal terminal VR1, so that the signal of the first pull-down node PD1 is equivalent to the low level signal of the second reference signal terminal VR2, thereby controlling the seventh switching transistor M7 to be turned on. The turned-on seventh switching transistor M7 provides the high level signal of the first reference signal terminal VR1 to the output signal terminal OUT, so that the output signal terminal OUT outputs the high level signal to reset the output signal terminal OUT. The ninth switching transistor M9 is turned off due to CK0=1. Therefore, the second reference signal terminal VR2 is disconnected from the first reference signal terminal VR1, so that the signal of the second pull-down node PD2 is equivalent to the low level signal of the second reference signal terminal VR2, thereby controlling the tenth switching transistor M10 to be turned on. The turned-on tenth switching transistor M10 provides the high level signal of the first reference signal terminal VR1 to the output signal terminal OUT, so that the output signal terminal OUT outputs the high level signal to reset the output signal terminal OUT.

After stage T4, a stage T5 may also be included, i.e., INPUT=1, CK0=0. The eleventh switching transistor M11 is turned off due to INPUT=1. Because of INPUT=1 and CK0=0, the NAND gate outputs a high level signal to control the second switching transistor M2 to be turned off. Therefore, the pull-up node PU is in floating connection, and the signal of the pull-up node PU can maintain a high level signal due to the function of the storage capacitor Cst, so as to control the third switching transistor M3 and the sixth switching transistor M6 to be turned off. Since the sixth switching transistor M6 is turned off, the second reference signal terminal VR2 is disconnected from the first reference signal terminal VR1, so that the signal of the first pull-down node PD1 is equivalent to the low level signal of the second reference signal terminal VR2, thereby controlling the seventh switching transistor M7 to be turned on. The turned-on seventh switching transistor M7 provides the high level signal of the first reference signal terminal VR1 to the output signal terminal OUT, so that the output signal terminal OUT outputs the high level signal. The ninth switching transistor M9 is turned on due to CK0=0. Therefore, the second reference signal terminal VR2 and the first reference signal terminal VR1 are connected through the eighth switching transistor M8 and the ninth switching transistor M9, so that the signal of the second pull-down node PD2 is equivalent to the high level signal of the first reference signal terminal VR1, thereby controlling the tenth switching transistor M10 to be turned off.

According to the shift register provided in the embodiment of this disclosure, after the T5 stage, the operations of the T4 stage and the T5 stage may be repeatedly performed until the signal of the input signal terminal INPUT becomes a low level signal again.

As can be seen from the embodiment, the shift register provided in the embodiment of this disclosure only needs to input one clock signal to make the output signal terminal output the shifted signal, which can reduce the number of the set clock signal lines, thereby reduce the wiring difficulty and the occupied space, and is good for the narrow frame design of the display panel.

The shift register provided in the embodiment of this disclosure may also control a duration of the valid pulse signal output by the output signal terminal only by changing a duration of the valid pulse signal of the clock signal terminal (i.e., the signal in the clock signal terminal having the same level as the valid pulse signal of the input signal terminal), without changing the circuit and the process, which can reduce the difficulty of the shift register, reduce the process complexity, and reduce the cost.

Figure 8B:
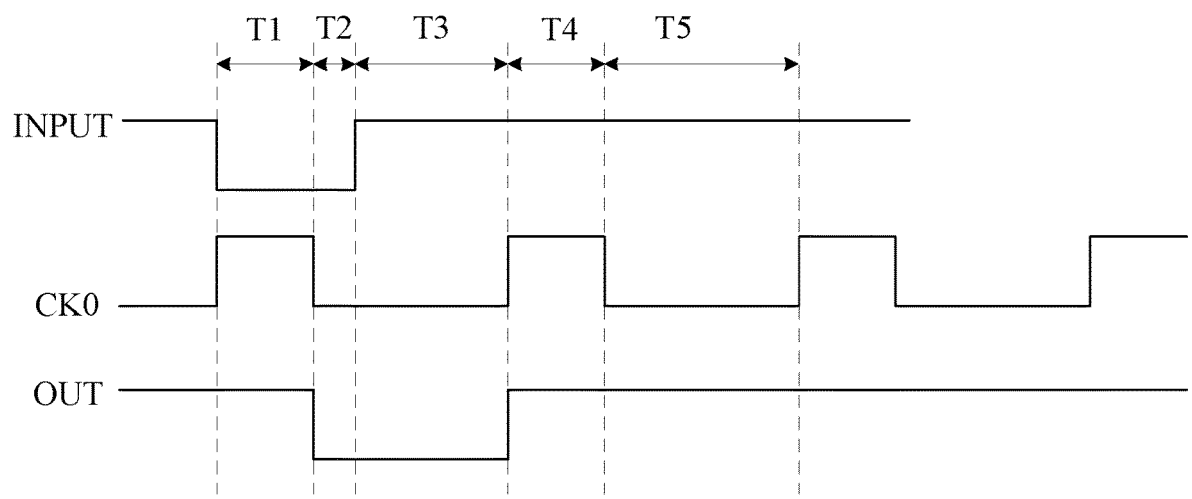
FIG. 8b is a fourth circuit timing diagram according to an embodiment of this disclosure.

The operation of the shift register provided in the embodiment of this disclosure will be described below in conjunction with the circuit timing diagram shown in FIG. 8b, by taking the structure of the shift register shown in FIG. 7 as an example. The duration of the low level signal of the clock signal terminal CK0 in one period in FIG. 8b is longer than the duration of the low level signal of the clock signal terminal CK0 in one period in FIG. 8a. The duration of the valid pulse signal of the input signal terminal INPUT in FIG. 8b is the same as the duration of the valid pulse signal of the input signal terminal INPUT in FIG. 8a. Also, in one display frame, only one falling edge of the clock signal terminal CK0 is located between the falling edge and the rising edge of the input signal terminal INPUT. Specifically, four stages T1, T2, T3 and T4 in FIG. 8b are selected.

In the T1 stage, INPUT=0, CK0=1. Its specific operation is the same as the operation of the T1 stage described above, and is not described in detail herein.

In the T2 stage, INPUT=0, CK0=0. Its specific operation is the same as the operation of the T2 stage described above, and is not described in detail herein.

In the T3 stage, INPUT=1, CK0=0. Its specific operation is the same as the operation of the T3 stage described above, and is not described in detail herein.

In the T4 stage, INPUT=1, CK0=1. Its specific operation is the same as the operation of the T4 stage described above, and is not described in detail herein.

Of course, a T5 stage may be also included after the T4 stage, where INPUT=1; CK0=0. Its specific operation is the same as the operation of the T5 stage described above, and is not described in detail here.

According to the shift register provided in the embodiment of this disclosure, after the T5 stage, the operations of the T4 stage and the T5 stage may be repeatedly performed until the signal of the input signal terminal INPUT becomes a high level signal again.

Figure 9:
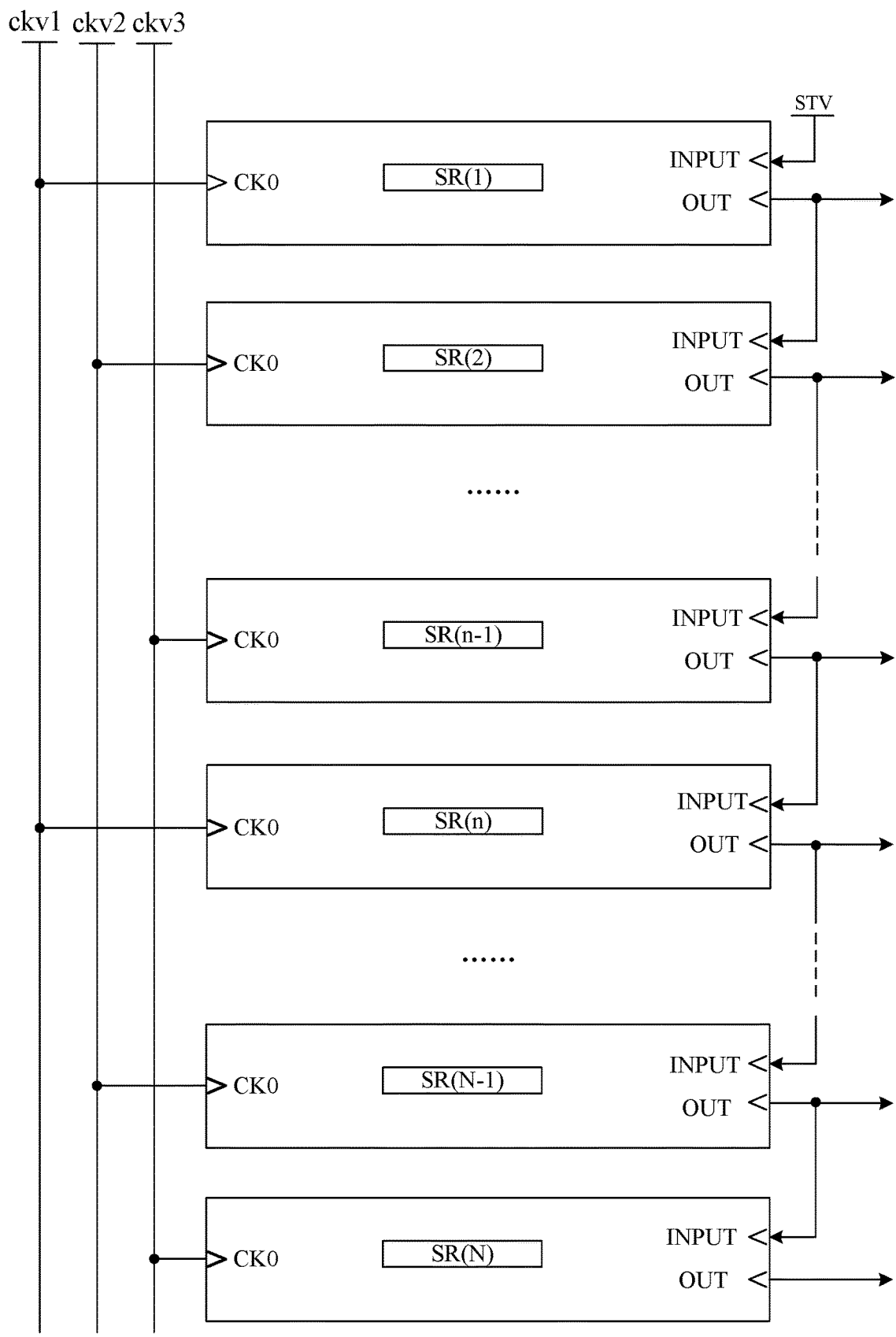
FIG. 9 is a schematic diagram showing a structure of a gate drive circuit according to an embodiment of this disclosure.

Based on the same concept, an embodiment of this disclosure further provides a gate drive circuit, as shown in FIG. 9, comprising: a plurality of cascaded shift registers provided in the embodiments of this disclosure: SR(1), SR(2), . . . , SR(n), . . . SR(N-1), SR(N) (in total N shift registers, 1≤n≤N), wherein the input signal terminal INPUT of the first stage SR(1) of the shift registers is connected with a frame trigger signal terminal STV; and except for the first stage SR(1) of the shift registers, the input signal terminals INPUT of other stages SR(n) of the shift registers are respectively connected with the output signal terminal OUT of their adjacent previous stage SR (n-1) of the shift registers.

Specifically, the specific function and structure of each shift register in the gate drive circuit is the same as the shift register in this disclosure, and the repeated parts are not repeated.

In a specific implementation, in the embodiment of this disclosure, as shown in FIG. 9, the clock signal terminals CK0 of the (3k-2)th stage shift register are all connected with the same clock line, i.e., all connected with the first clock line ckv1. The clock signal terminals CK0 of the (3k-1)th stage shift registers are all connected with the same clock line, i.e., all connected with a second clock line ckv2. The clock signal terminals CK0 of the (3k)th stage shift register are all connected with the same clock line, i.e., all connected with a third clock line ckv3; wherein k is a positive integer.

In a specific implementation, the gate drive circuit provided in the embodiment of this disclosure may be applied to a Liquid Crystal Display (LCD) panel, and may also be applied to an Organic Light-Emitting Diode (OLED) Display panel, which is not limited herein. In addition, the grid drive circuit in the embodiment of the invention can drive the gate lines in the display panel only by three clock signal lines, which is good for the narrow frame design of the display panel.

Based on the same concept, an embodiment of this disclosure further provides a display device comprising the gate drive circuit provided in the embodiment of this disclosure. The principle of the display device for solving the problem is similar to that of the shift register, so the implementation of the display device can refer to the implementation of the shift register, and the repetition is not repeated here.

In a specific implementation, the display device provided in the embodiment of this disclosure may be: any product or component with display function such as mobile phone, tablet computer, television, display, notebook computer, digital photo frame, navigator. Other essential components of the display device are understood by those skilled in the art and are not described in detail herein, and cannot limit this disclosure.

According to the shift register, the gate drive circuit and the display device provided in the embodiments of this disclosure, the signal of the input signal terminal is provided to the pull-up node by the input circuit under the control of the input signal terminal; and the signal of the second reference signal terminal is provided to the output signal terminal by the output circuit under the control of the clock signal terminal and the signal of the pull-up node, so that the output signal terminal outputs a valid pulse signal. The signal of the first reference signal terminal is provided to the pull-up node by the reset circuit under the control of the input signal terminal and the clock signal terminal so as to reset the pull-up node. The pull-down control circuit resets the output signal terminal according to the signal of the first reference signal terminal so as to enable the output signal terminal to output an invalid pulse signal. In this way, through the cooperation of the four circuits, the shift register can realize normal shift output only under the control of the signal of one clock signal terminal, so that the output signal terminal of the shift register outputs a scan signal required by a corresponding gate line, which can reduce the number of the set clock signal lines, further reduces wiring difficulty and the occupied space, and is good for the narrow frame design of the display panel.

It will be apparent to those skilled in the art that various variations and modifications can be made to this disclosure without departing from the spirit and scope of this disclosure. Thus, provided that these modifications and variations of this disclosure are within the scope of the claims of this disclosure and their equivalents, this disclosure is also intended to encompass these modifications and variations.

What is claimed is:

1. A shift register comprising:
an input circuit, a reset circuit, a pull-down control circuit and an output circuit;
wherein:
the input circuit is configured to, under control of an input signal terminal, provide a signal of the input signal terminal to a pull-up node;
the reset circuit is configured to, under the control of the input signal terminal and a clock signal terminal, provide a signal of a first reference signal terminal to the pull-up node;
the output circuit is configured to, under the control of the clock signal terminal and a signal of the pull-up node, provide a signal of a second reference signal terminal to an output signal terminal; and
the pull-down control circuit is configured to reset the output signal terminal according to the signal of the first reference signal terminal.

2. The shift register according to claim 1, wherein:
the output circuit comprises a third switching transistor, a fourth switching transistor, and a storage capacitor;
a gate electrode of the third switching transistor is connected with the pull-up node, a first electrode of the third switching transistor is connected with the clock signal terminal, and a second electrode of the third switching transistor is connected with a gate electrode of the fourth switching transistor;
a first electrode of the fourth switching transistor is connected with the second reference signal terminal, and a second electrode of the fourth switching transistor is connected with the output signal terminal; and
the storage capacitor is connected between the pull-up node and the output signal terminal.

3. The shift register according to claim 1, wherein:
the pull-down control circuit comprises a first pull-down control sub-circuit;
the first pull-down control sub-circuit is configured to provide the signal of the first reference signal terminal to the output signal terminal when a level of the signal of the pull-up node is opposite to a level of a valid pulse signal of the input signal terminal.

4. The shift register according to claim 3, wherein:
the first pull-down control sub-circuit comprises a fifth switching transistor, a sixth switching transistor, and a seventh switching transistor;
a gate electrode and a first electrode of the fifth switching transistor are both connected with the second reference signal terminal, and a second electrode of the fifth switching transistor is connected with a first pull-down node;
a gate electrode of the sixth switching transistor is connected with the pull-up node, a first electrode of the sixth switching transistor is connected with the first reference signal terminal, and a second electrode of the sixth switching transistor is connected with the first pull-down node;
a gate electrode of the seventh switching transistor is connected with the first pull-down node, a first electrode of the seventh switching transistor is connected with the first reference signal terminal, and a second electrode of the seventh switching transistor is connected with the output signal terminal.

5. The shift register according to claim 1, wherein:
the pull-down control circuit comprises a second pull-down control sub-circuit;
the second pull-down control sub-circuit is configured to provide the signal of the first reference signal terminal to the output signal terminal when a level of the clock signal terminal is opposite to a level of a valid pulse signal of the input signal terminal.

6. The shift register according to claim 5, wherein:
the second pull-down control sub-circuit comprises an eighth switching transistor, a ninth switching transistor, and a tenth switching transistor;

a gate electrode and a first electrode of the eighth switching transistor are both connected with the second reference signal terminal, and a second electrode of the eighth switching transistor is connected with the second pull-down node;

a gate electrode of the ninth switching transistor is connected with the clock signal terminal, a first electrode of the ninth switching transistor is connected with the first reference signal terminal, and a second electrode of the ninth switching transistor is connected with the second pull-down node;

a gate electrode of the tenth switching transistor is connected with the second pull-down node, a first electrode of the tenth switching transistor is connected with the first reference signal terminal, and a second electrode of the tenth switching transistor is connected with the output signal terminal.

7. The shift register according to claim 1, wherein:
the pull-down control circuit comprises a first pull-down control sub-circuit and a second pull-down control sub-circuit;
the first pull-down control sub-circuit is configured to provide the signal of the first reference signal terminal to the output signal terminal when a level of the signal of the pull-up node is opposite to a level of a valid pulse signal of the input signal terminal;
the second pull-down control sub-circuit is configured to provide the signal of the first reference signal terminal to the output signal terminal when a level of the clock signal terminal is opposite to the level of the valid pulse signal of the input signal terminal.

8. The shift register according to claim 7, wherein:
the first pull-down control sub-circuit comprises a fifth switching transistor, a sixth switching transistor, and a seventh switching transistor;
a gate electrode and a first electrode of the fifth switching transistor are both connected with the second reference signal terminal, and a second electrode of the fifth switching transistor is connected with a first pull-down node;
a gate electrode of the sixth switching transistor is connected with the pull-up node, a first electrode of the sixth switching transistor is connected with the first reference signal terminal, and a second electrode of the sixth switching transistor is connected with the first pull-down node;
a gate electrode of the seventh switching transistor is connected with the first pull-down node, a first electrode of the seventh switching transistor is connected with the first reference signal terminal, and a second electrode of the seventh switching transistor is connected with the output signal terminal.

9. The shift register according to claim 7, wherein:
the second pull-down control sub-circuit comprises an eighth switching transistor, a ninth switching transistor, and a tenth switching transistor;
a gate electrode and a first electrode of the eighth switching transistor are both connected with the second reference signal terminal, and a second electrode of the eighth switching transistor is connected with the second pull-down node;
a gate electrode of the ninth switching transistor is connected with the clock signal terminal, a first electrode of the ninth switching transistor is connected with the first reference signal terminal, and a second electrode of the ninth switching transistor is connected with the second pull-down node;

a gate electrode of the tenth switching transistor is connected with the second pull-down node, a first electrode of the tenth switching transistor is connected with the first reference signal terminal, and a second electrode of the tenth switching transistor is connected with the output signal terminal.

10. The shift register according to claim 1, wherein:
the input circuit includes an eleventh switching transistor; and
a gate electrode and a first electrode of the eleventh switching transistor are both connected with the input signal terminal, and a second electrode of the eleventh switching transistor is connected with the pull-up node.

11. A gate drive circuit comprising:
a plurality of cascaded shift registers, each shift register according to claim 1;
wherein the input signal terminal of a first stage of the plurality of cascaded shift registers is connected with a frame trigger signal terminal; and
except for the first stage of the plurality of cascaded shift registers, the input signal terminals of other stages of the plurality of cascaded shift registers are respectively connected with the output signal terminals of an adjacent previous stage of the plurality of cascaded shift registers.

12. A display device comprising the gate drive circuit according to claim 11.

13. The shift register according to claim 1, wherein:
the reset circuit comprises a clock converting circuit and a switching transistor;
a first input terminal of the clock converting circuit is connected with the input signal terminal, a second input terminal of the clock converting circuit is connected with the clock signal terminal, and an output terminal of the clock converting circuit is connected with a gate electrode of a first switching transistor;
a first electrode of the first switching transistor is connected with the first reference signal terminal, and a second electrode of the first switching transistor is connected with the pull-up node.

14. The shift register according to claim 13, wherein:
the clock converting circuit is a NOR gate and the switching transistor is the first switching transistor;
a first input terminal of the NOR gate is connected with the input signal terminal, a second input terminal of the NOR gate is connected with the clock signal terminal, and an output terminal of the NOR gate is connected with a gate electrode of the first switching transistor;
a first electrode of the first switching transistor is connected with the first reference signal terminal, and the second electrode of the first switching transistor is connected with the pull-up node.

15. The shift register according to claim 14, wherein:
the NOR gate comprise a twelfth switching transistor M12, a thirteenth switching transistor M13, a fourteenth switching transistor M14, a fifteenth switching transistor M15, a sixteenth switching transistor M16, a seventeenth switching transistor M17, an eighteenth switching transistor M18, and a nineteenth switching transistor M19;
a gate electrode of the twelfth switching transistor M12 is connected with the input signal terminal INPUT, a first electrode of the twelfth switching transistor M12 is connected with the first reference signal terminal VR1, and a second electrode of the twelfth switching transistor M12 is connected with a gate electrode of the fifteenth switching transistor M15;

a gate electrode of the thirteenth switching transistor M13 is connected with the clock signal terminal CK0, a first electrode of the thirteenth switching transistor M13 is connected with the first reference signal terminal VR1, and a second electrode of the thirteenth switching transistor M13 is connected with the gate electrode of the fifteenth switching transistor M15;

a gate electrode and a first electrode of the fourteenth switching transistor M14 are both connected with the second reference signal terminal VR2, and a second electrode of the fourteenth switching transistor M14 is connected with the gate electrode of the fifteenth switching transistor M15;

a first electrode of the fifteenth switching transistor M15 is connected with the first reference signal terminal VR1, and a second electrode of the fifteenth switching transistor M15 is connected with a gate electrode of the eighteenth switching transistor M18;

a gate electrode of the sixteenth switching transistor M16 is connected with the input signal terminal INPUT, a first electrode of the sixteenth switching transistor M16 is connected with the second reference signal terminal VR2, and a second electrode of the sixteenth switching transistor M16 is connected with the gate electrode of the eighteenth switching transistor M18;

a gate electrode of the seventeenth switching transistor M17 is connected with the clock signal terminal CK0, a first electrode of the seventeenth switching transistor M17 is connected with the second reference signal terminal VR2, and a second electrode of the seventeenth switching transistor M17 is connected with the gate electrode of the eighteenth switching transistor M18;

a first electrode of the eighteenth switching transistor M18 is connected with the first reference signal terminal VR1, and a second electrode of the eighteenth switching transistor M18 is connected with the gate electrode of the first switching transistor M1;

a gate electrode and a first electrode of the nineteenth switching transistor M19 are both connected with the second reference signal terminal VR2, and a second electrode of the nineteenth switching transistor M19 is connected with the gate electrode of the first switching transistor M1.

16. The shift register according to claim 14, wherein:
a first input terminal of the NOR gate is connected with the input signal terminal, a second input terminal of the NOR gate is connected with the clock signal terminal, and the output terminal of the NOR gate is connected with a gate electrode of the first switching transistor;
a first electrode of the first switching transistor is connected with the first reference signal terminal, and a second electrode of the first switching transistor is connected with the pull-up node;
the output circuit comprises a third switching transistor, a fourth switching transistor, and a storage capacitor;
a gate electrode of the third switching transistor is connected with the pull-up node, a first electrode of the third switching transistor is connected with the clock signal terminal, and a second electrode of the third switching transistor is connected with a gate electrode of the fourth switching transistor;
a first electrode of the fourth switching transistor is connected with the second reference signal terminal, and a second electrode of the fourth switching transistor is connected with the output signal terminal; and the storage capacitor is connected between the pull-up node and the output signal terminal;
the pull-down control circuit comprises a first pull-down control sub-circuit and a second pull-down control sub-circuit;
the first pull-down control sub-circuit is configured to provide the signal of the first reference signal terminal to the output signal terminal when a level of the signal of the pull-up node is opposite to a level of a valid pulse signal of the input signal terminal;
the second pull-down control sub-circuit is configured to provide the signal of the first reference signal terminal to the output signal terminal when a level of the clock signal terminal is opposite to the level of the valid pulse signal of the input signal terminal;
the first pull-down control sub-circuit comprises a fifth switching transistor, a sixth switching transistor, and a seventh switching transistor;
a gate electrode and a first electrode of the fifth switching transistor are both connected with the second reference signal terminal, and a second electrode of the fifth switching transistor is connected with a first pull-down node;
a gate electrode of the sixth switching transistor is connected with the pull-up node, a first electrode of the sixth switching transistor is connected with the first reference signal terminal, and a second electrode of the sixth switching transistor is connected with the first pull-down node;
a gate electrode of the seventh switching transistor is connected with the first pull-down node, a first electrode of the seventh switching transistor is connected with the first reference signal terminal, and a second electrode of the seventh switching transistor is connected with the output signal terminal;
the second pull-down control sub-circuit comprises an eighth switching transistor, a ninth switching transistor, and a tenth switching transistor;
a gate electrode and a first electrode of the eighth switching transistor are both connected with the second reference signal terminal, and a second electrode of the eighth switching transistor is connected with the second pull-down node;
a gate electrode of the ninth switching transistor is connected with the clock signal terminal, a first electrode of the ninth switching transistor is connected with the first reference signal terminal, and a second electrode of the ninth switching transistor is connected with the second pull-down node;
a gate electrode of the tenth switching transistor is connected with the second pull-down node, a first electrode of the tenth switching transistor is connected with the first reference signal terminal, and a second electrode of the tenth switching transistor is connected with the output signal terminal;
the input circuit includes an eleventh switching transistor; and
a gate electrode and a first electrode of the eleventh switching transistor are both connected with the input signal terminal, and a second electrode of the eleventh switching transistor is connected with the pull-up node.

17. The shift register according to claim 13, wherein:
the clock converting circuit is a NAND gate and the switching transistor is a second switching transistor;
a first input terminal of the NAND gate is connected with the input signal terminal, a second input terminal of the NAND gate is connected with the clock signal terminal, and an output terminal of the NAND gate is connected with a gate electrode of the second switching transistor;

a first electrode of the second switching transistor is connected with the first reference signal terminal, and a second electrode of the second switching transistor is connected with the pull-up node.

18. The shift register according to claim 17, wherein:

a first input terminal of the NAND gate is connected with the input signal terminal, a second input terminal of the NAND gate is connected with the clock signal terminal, and the output terminal of the NAND gate is connected with a gate electrode of the second switching transistor;

a first electrode of the second switching transistor is connected with the first reference signal terminal, and a second electrode of the second switching transistor is connected with the pull-up node;

the output circuit comprises a third switching transistor, a fourth switching transistor, and a storage capacitor;

a gate electrode of the third switching transistor is connected with the pull-up node, a first electrode of the third switching transistor is connected with the clock signal terminal, and a second electrode of the third switching transistor is connected with a gate electrode of the fourth switching transistor;

a first electrode of the fourth switching transistor is connected with the second reference signal terminal, and a second electrode of the fourth switching transistor is connected with the output signal terminal; and the storage capacitor is connected between the pull-up node and the output signal terminal;

the pull-down control circuit comprises a first pull-down control sub-circuit and a second pull-down control sub-circuit;

the first pull-down control sub-circuit is configured to provide the signal of the first reference signal terminal to the output signal terminal when a level of the signal of the pull-up node is opposite to a level of a valid pulse signal of the input signal terminal;

the second pull-down control sub-circuit is configured to provide the signal of the first reference signal terminal to the output signal terminal when a level of the clock signal terminal is opposite to the level of the valid pulse signal of the input signal terminal;

the first pull-down control sub-circuit comprises a fifth switching transistor, a sixth switching transistor, and a seventh switching transistor;

a gate electrode and a first electrode of the fifth switching transistor are both connected with the second reference signal terminal, and a second electrode of the fifth switching transistor is connected with a first pull-down node;

a gate electrode of the sixth switching transistor is connected with the pull-up node, a first electrode of the sixth switching transistor is connected with the first reference signal terminal, and a second electrode of the sixth switching transistor is connected with the first pull-down node;

a gate electrode of the seventh switching transistor is connected with the first pull-down node, a first electrode of the seventh switching transistor is connected with the first reference signal terminal, and a second electrode of the seventh switching transistor is connected with the output signal terminal;

the second pull-down control sub-circuit comprises an eighth switching transistor, a ninth switching transistor, and a tenth switching transistor;

a gate electrode and a first electrode of the eighth switching transistor are both connected with the second reference signal terminal, and a second electrode of the eighth switching transistor is connected with the second pull-down node;

a gate electrode of the ninth switching transistor is connected with the clock signal terminal, a first electrode of the ninth switching transistor is connected with the first reference signal terminal, and a second electrode of the ninth switching transistor is connected with the second pull-down node;

a gate electrode of the tenth switching transistor is connected with the second pull-down node, a first electrode of the tenth switching transistor is connected with the first reference signal terminal, and a second electrode of the tenth switching transistor is connected with the output signal terminal;

the input circuit includes an eleventh switching transistor; and a gate electrode and a first electrode of the eleventh switching transistor are both connected with the input signal terminal, and a second electrode of the eleventh switching transistor is connected with the pull-up node.

19. A method for performing shift output through the shift register according to claim 1, wherein normal shift output is performed by the shift register under the control of the signal of only one clock signal terminal through cooperation of the input circuit, the reset circuit, the pull-down control circuit and the output circuit in the shift register.

* * * * *

UNITED STATES PATENT AND TRADEMARK OFFICE
CERTIFICATE OF CORRECTION

PATENT NO. : 11,107,545 B2  
APPLICATION NO. : 16/495206  
DATED : August 31, 2021  
INVENTOR(S) : Can Yuan et al.

Page 1 of 1

It is certified that error appears in the above-identified patent and that said Letters Patent is hereby corrected as shown below:

On the Title Page

Column 1, Item (65) Prior Publication Data, Line 2, below "May 21, 2020" insert:
-- Foreign Application Priority Data
Apr. 12, 2018 (CN) ....................... 201810326790.0 --

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*